United States Patent
Lee et al.

(10) Patent No.: US 6,982,215 B1
(45) Date of Patent: Jan. 3, 2006

(54) N TYPE IMPURITY DOPING USING IMPLANTATION OF $P_2+$ IONS OR $AS_{2+}$ IONS

(75) Inventors: Buan Heng Lee, Singapore (SG); Teck Hong Low, Singapore (SG); Hai Rong Wang, Singapore (SG); Tang Ying, Singapore (SG); Zadig Cherng-Ching Lam, Arcadia, CA (US)

(73) Assignee: Chartered Semiconductor Manufacturing Ltd., Singapore (SG)

(*) Notice: Subject to any disclaimer, the term of this patent is extended or adjusted under 35 U.S.C. 154(b) by 942 days.

(21) Appl. No.: 09/186,388

(22) Filed: Nov. 5, 1998

(51) Int. Cl.
*H01L 21/425* (2006.01)

(52) U.S. Cl. ...................... 438/514; 438/530

(58) Field of Classification Search ............... 438/515, 438/514, 522, 530, 535, 961
See application file for complete search history.

(56) References Cited

U.S. PATENT DOCUMENTS

| | | | | |
|---|---|---|---|---|
| 4,560,879 A | * | 12/1985 | Wu et al. ............... | 250/492.2 |
| 4,578,589 A | * | 3/1986 | Aitken .................. | 250/492.2 |
| 5,155,369 A | * | 10/1992 | Current ................. | 250/492.2 |

OTHER PUBLICATIONS

S. Wolf, R. Tauber. Silicon Processing for the VLSI Era, vol. 1: Process Technology. Lattice Press, California, 1986. pp. 305-307.*
S. Wolf. Silicon Processing for the VLSI Era, vol. 2: Process Integration. Lattice Press, California, 1990. pp. 332-334.*
S.Wolf et al. "Silicon Processing for the VLSI Era" vol. 1 Lattice Press, Sunset Beach, CA, 1990, p 327.

* cited by examiner

*Primary Examiner*—Long Pham
*Assistant Examiner*—Ginette Peralta
(74) *Attorney, Agent, or Firm*—George O. Saile; Rosemary L. S. Pike

(57) ABSTRACT

A method for using ion implantation to implant phosphorous or arsenic impurities into shallow source/drain regions or into polysilicon electrodes used in devices having shallow source/drain electrodes. A phosphorous source having an abundance of $P_2+$ ions is used in an ion beam system adjusted to select $P_2+$ ions. Since each ion contains two phosphorous atoms the ion beam requires twice the beam energy and half the beam density. This provides good wafer throughput and improved source life. An arsenic source having an abundance of $As_2+$ ions can be substituted for the solid phosphorous source resulting in a beam of $As_2+$ ions.

28 Claims, 2 Drawing Sheets

N TYPE IMPURITY DOPING USING IMPLANTATION OF $P_2+$ IONS OR $AS_{2+}$ IONS

BACKGROUND OF THE INVENTION (1) Field of the Invention

This invention relates to the use of an ion implantation beam of $P_2+$ ions or $As_2+$ ions to dope N type shallow junction source/drain regions or gate electrodes used in devices with shallow source/drain regions. Use of the $P_2+$ ions or $As_2+$ ions uses lower ion density and higher beam energy resulting in improved throughput and ion source life.

(2) Description of the Related Art

As junctions become very shallow the use of $P^+$ ion beams or $As^+$ ion beams becomes a problem because beam energies must be kept very low while the beam ion densities must be kept very high. These requirements leads to reduced ion source life and reduced wafer throughput. This invention overcomes this problem using $P_2+$ ion beams or $As_2+$ ion beams.

U.S. Pat. No. 5,155,369 to Current describes a method of using two doses of ions in an ion beam to provide implantation for shallow junction devices. A first dose of ions is implanted to produce a damaged layer through which a second dose of ions is directed. The damaged layer scatters the second dose of ions and channeling is avoided.

In their book "Silicon Processing for the VLSI Era, Volume I", by Wolf and Tauber, Lattice Press, 1990, page 327, Wolf and Tauber discuss ion implantation using doubly charged species.

SUMMARY OF THE INVENTION

Ion implantation is used frequently in the manufacture of integrated circuits. Ion beams are used to implant impurities into semiconductor wafers to provide doping for source/drain regions, polysilicon electrode patterns, and the like. In ion beam implantation the beam energy and ion density are chosen to provide the desired impurity profile after implantation. One problem encountered as device geometries become smaller and source/drain junction depths become smaller is that the ion beam energy must become lower, in some cases less than 10 KeV. At these low energies it is difficult to obtain sufficient ion beam density resulting in lower throughput rates and increased implant cycle times, which directly impact cost. In addition the ion sources are stressed by these conditions and must be replaced with increased frequency.

It is a principle objective of this invention to provide a method of implanting phosphorous in source/drain regions using ion beam implantation with increased beam energy in applications having very shallow junctions.

It is another principle objective of this invention to provide a method of implanting arsenic in source/drain regions using ion beam implantation with increased beam energy in applications having very shallow junctions.

It is another principle objective of this invention to provide a method of implanting phosphorous in polysilicon electrodes using ion beam implantation with increased beam energy in applications having very shallow junctions.

It is another principle objective of this invention to provide a method of implanting arsenic in polysilicon electrodes using ion beam implantation with increased beam energy in applications having very shallow junctions.

These objectives are achieved by using ion sources such as solid phosphorous, phosphine gas, solid arsenic, or SDS arsine in the ion beam apparatus. The magnetic analyzer of the ion beam apparatus is then adjusted to select either the $P_2+$ or the $As_2+$ isotopes for the ion beam. These ion beams can then be implanted using energies of 20 KeV or greater.

DESCRIPTION OF THE PREFERRED EMBODIMENTS

Figure 1:
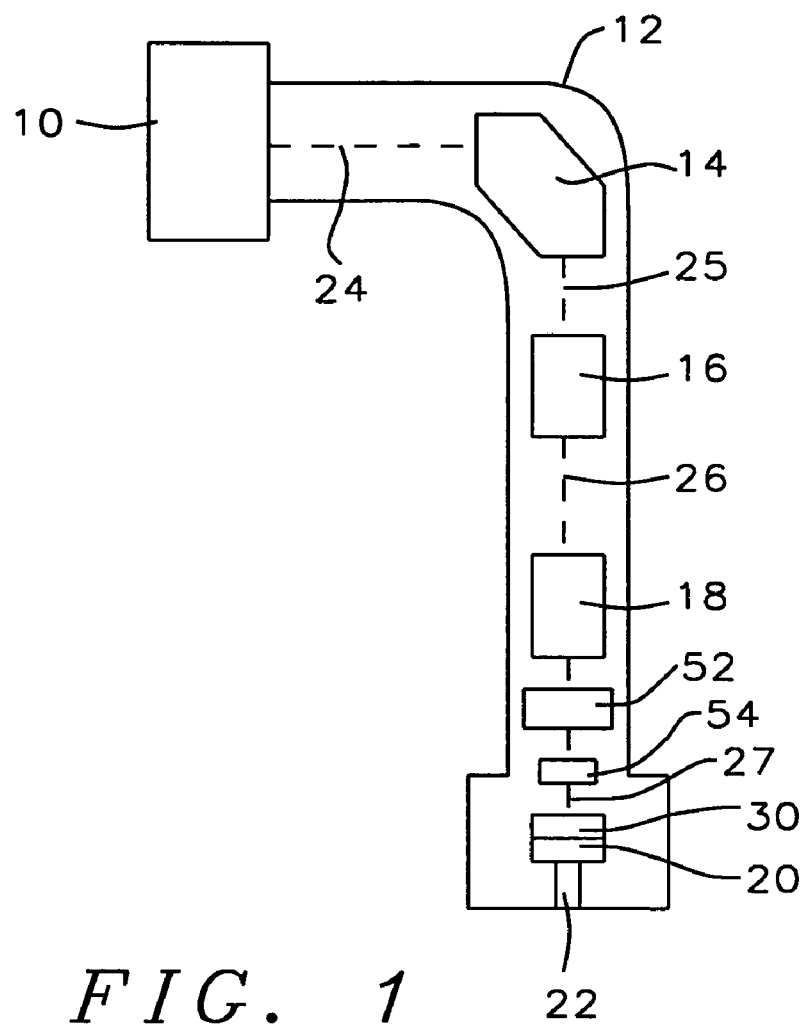
FIG. 1 shows a schematic view of an ion beam apparatus.

The preferred embodiments of this invention will now be described with reference to FIGS. 1–4. FIG. 1 shows a schematic view of an ion beam apparatus. Different ion beam systems may differ from the one shown and described herein but certain key features will be common to all ion beam systems. The ion beam apparatus has an ion source 10 which uses a small accelerating voltage to inject an ion beam 24 into an evacuated enclosure 12. Ion sources can be solid materials or gasses such as solid phosphorous, phosphine gas, solid arsenic, or SDS arsine.

Referring again to FIG. 1, the beam then enters a magnetic analyzer 14 which is selected to select particles with a particular mass to charge ratio for the beam 25 exiting the magnetic analyzer. For the example of an ion source 10 using solid phosphorous or phosphine gas the magnetic analyzer 14 is adjusted to select singly charged $P_2$ ions which have a mass of 62 atomic mass units and a charge equal to the charge of a single electron. These ions will be designated as $P_2+$ ions. Solid phosphorous or phosphine gas provide an abundance of $P_2$ isotopes. Solid arsenic or SDS arsine can also be used as the ion source 10. In this case the magnetic analyzer 14 is adjusted to select singly charged $As_2$ ions which have a mass of 150 atomic mass units and a charge equal to the charge of a single electron. These ions will be designated as $As_2+$ ions. Solid arsenic or SDS arsine provide an abundance of $As_2$ isotopes.

As shown in FIG. 1, the ion beam 25 exiting the magnetic analyzer 14 is then directed through a voltage accelerator/decelerator 16 where the selected beam energy is imparted to the ion beam 25. The ion beam 26 exiting the voltage accelerator/decelerator 16 passes through a scanning system 18 which directs the ion beam. The ion beam exiting the scanning system 18 passes through an energy filter 52, to provide improved energy uniformity, and a plasma flood gun 54, to neutralize any charge buildup on the wafer during ion implantation. The ion beam 27 exiting the plasma flood gun 54 is directed, by the scanning system 18, to the proper location on an integrated circuit wafer 30 which is attached to a wafer holder 20. A coupling mechanism 22 attaches the wafer holder 20 to the evacuated enclosure 12. In this manner the ion beam 27 exiting the scanning system can be used to implant impurities into source/drain regions or into polysilicon electrodes.

Figure 2:
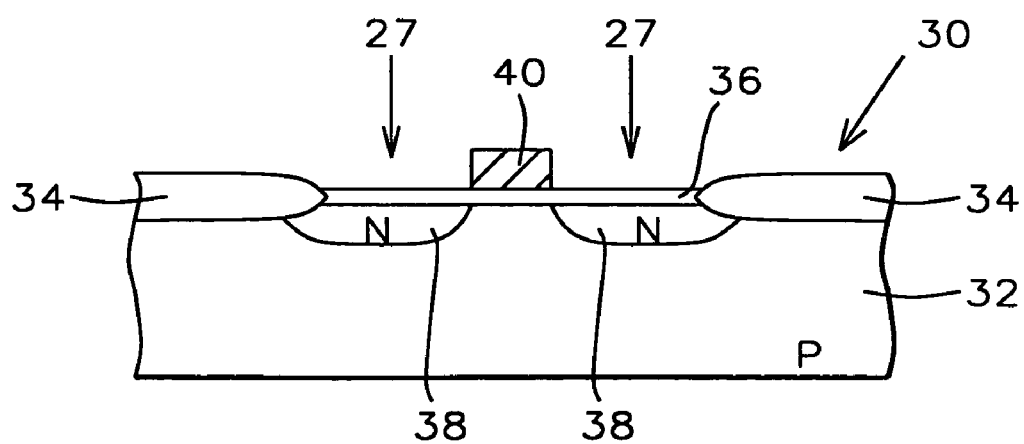
FIG. 2 shows a cross section view of a part of an integrated circuit wafer showing an ion beam being used to implant impurities into source/drain regions.

FIG. 2 shows a part of the wafer 30 which is held in place by the wafer holder in the evacuated enclosure. The wafer comprises a substrate, in this example a P type silicon substrate, having field oxide isolation regions 34 and a gate oxide layer 36. A gate electrode 40 is formed on the gate oxide layer 36. The ion beam 27 is used to implant impurities into the source/drain regions 38. In this example the ion beam 27 is a P$_2$+ ion beam having a beam density of between about $4 \times 10^{14}$ and $6 \times 10^{14}$ ions/cm$^2$ and a beam energy of between about 20 and 48 KeV. The beam density used is one half that required for a beam of P$^+$ ions because two phosphorous atoms are implanted for every P$_2$+ ion implanted. The beam energy is double that would be required for a beam of P$^+$ ions because each of the P$_2$+ ions have two phosphorous atoms. After the implantation the wafer is rapidly annealed at an anneal temperature of between about 900° C. and 1100° C. for between about 10 and 20 seconds. This method produces shallow source/drain regions 38 using beam density and energy levels which maintain good throughput and source life.

Figure 3:
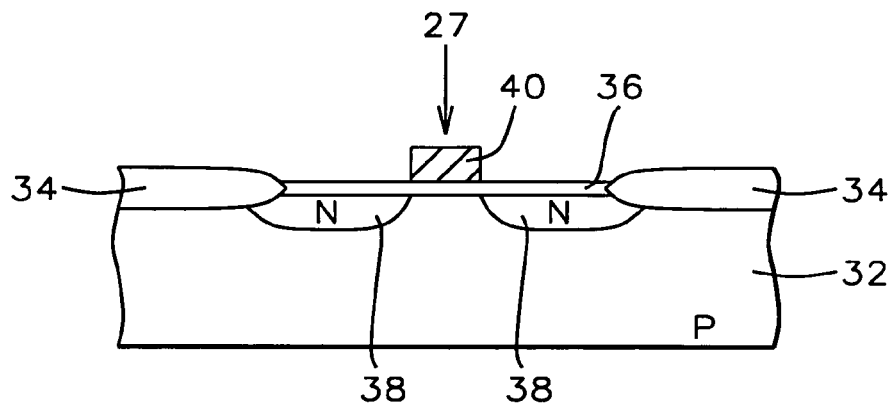
FIG. 3 shows a cross section view of a part of an integrated circuit wafer showing an ion beam being used to implant impurities into a polysilicon gate electrode.

FIG. 3 also shows a part of the wafer 30 which is held in place by the wafer holder in the evacuated enclosure. The wafer comprises a substrate, in this example a P type silicon substrate, having field oxide isolation regions 34 and a gate oxide layer 36. A polysilicon gate electrode 40 is formed on the gate oxide layer 36. The ion beam 27 is used to implant impurities into the polysilicon gate electrode 40. In this example the ion beam 27 is a P$_2$+ ion beam having a beam density of between about $4 \times 10^{14}$ and $6 \times 10^{14}$ ions/cm$^2$ and a beam energy of between about 20 and 48 KeV. The beam density used is one half that required for a beam of P$^+$ ions because two phosphorous atoms are implanted for every P$_2$+ ion implanted. The beam energy is double that would be required for a beam of P$^+$ ions because each of the P$_2$+ ions have two phosphorous atoms. After the implantation the wafer is annealed at an anneal temperature of between about 900° C. and 1100° C. for between about 10 and 20 seconds. This method produces good conductivity for the polysilicon gate electrode 40 using beam density and energy levels which maintain good throughput and source life.

Referring again to FIG. 2, an ion beam 27 of As$_2$+ ions can be used to implant impurities into the source/drain region 38. The wafer comprises a substrate, in this example a P type silicon substrate, having field oxide isolation regions 34 and a gate oxide layer 36. In this example the ion beam 27 is an As$_2$+ ion beam having a beam density of between about $4 \times 10^{14}$ and $6 \times 10^{14}$ ions/cm$^2$ and a beam energy of between about 20 and 48 KeV. The beam density used is one half that required for a beam of As$^+$ ions because two arsenic atoms are implanted for every As$_2$+ ion implanted. The beam energy is double that would be required for a beam of As$^+$ ions because each of the As$_2$+ ions have two arsenic atoms. After the implantation the wafer is annealed at an anneal temperature of between about 900° C. and 1100° C. for between about 10 and 20 seconds. This method produces shallow source/drain regions 38 using beam density and energy levels which maintain good throughput and source life.

Referring again to FIG. 3, an ion beam 27 of As$_2$+ ions can be used to implant impurities into the polysilicon gate electrode 40. The wafer comprises a substrate, in this example a P type silicon substrate, having field oxide isolation regions 34 and a gate oxide layer 36. In this example the ion beam 27 is an As$_2$+ ion beam having a beam density of between about $4 \times 10^{14}$ and $6 \times 10^{14}$ ions/cm$^2$ and a beam energy of between about 20 and 48 KeV. The beam density used is one half that required for a beam of As$^+$ ions because two arsenic atoms are implanted for every As$_2$+ ion implanted. The beam energy is double that would be required for a beam of As$^+$ ions because each of the As$_2$+ ions have two arsenic atoms. After the implantation the wafer is annealed at an anneal temperature of between about 900° C. and 1100° C. for between about 10 and 20 seconds. This method produces good conductivity for the polysilicon gate electrode 40 using beam density and energy levels which maintain good throughput and source life.

Figure 4:
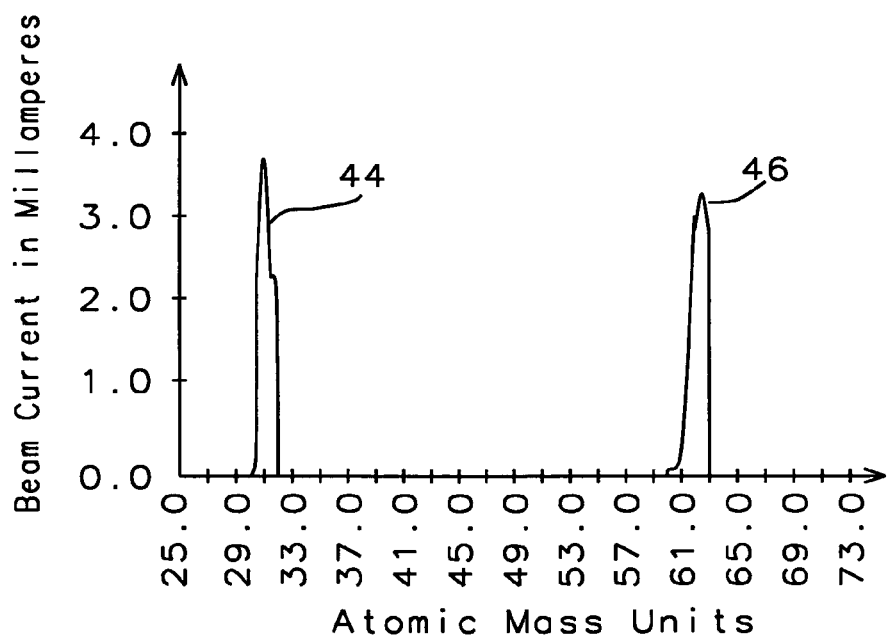
FIG. 4 shows an atomic mass unit spectrum of a solid phosphorous source with a beam energy of 30 KeV showing beam current as a function of atomic mass units.

FIG. 4 shows the AMU, atomic mass unit, spectrum for a source of solid phosphorous in an ion beam system using a beam energy of 30 KeV. The spectrum clearly shows a first beam current peak 44 at 31 atomic mass units and a second beam current peak 46 at 62 atomic mass units. This curve clearly shows that when the magnetic analyzer is adjusted to select phosphorous ions having 62 atomic mass units there is ample beam current available.

While the invention has been particularly shown and described with reference to the preferred embodiments thereof, it will be understood by those skilled in the art that various changes in form and details may be made without departing from the spirit and scope of the invention.

What is claimed is:

1. A method of forming source/drain regions, comprising the steps of:
   providing a semiconductor integrated circuit wafer having source/drain regions;
   providing an ion implant apparatus;
   placing a phosphorous ion source in said ion implant apparatus;
   adjusting said ion implant apparatus so that said ion implant apparatus produces an ion beam comprising P$_2$+ ions, wherein said ion beam has a beam density and a beam energy;
   implanting impurities into said source/drain regions of said integrated circuit wafer, wherein said impurities consist of P$_2$+ ions implanted using a single ion implantation step and said ion beam; and
   annealing said integrated circuit wafer having P$_2$+ ions implanted at an anneal temperature for an anneal time.

2. The method of claim 1 wherein said adjusting said ion implant apparatus so that said ion implant apparatus produces an ion beam comprising P$_2$+ ions uses a magnetic analyzer.

3. The method of claim 1 wherein said beam density is between about $4 \times 10^{14}$ and $6 \times 10^{14}$ ions/cm$^2$.

4. The method of claim 1 wherein said beam energy is between about 20 and 48 KeV.

5. The method of claim 1 wherein said anneal temperature is between about 900° C. and 1100° C.

6. The method of claim 1 wherein said anneal time is between about 10 and 20 seconds.

7. The method of claim 1 wherein said phosphorous ion source comprises solid phosphorous.

8. A method of forming source/drain regions, comprising the steps of:
   providing a semiconductor integrated circuit wafer having source/drain regions;
   providing an ion implant apparatus;
   placing an arsenic ion source in said ion implant apparatus;
   adjusting said ion implant apparatus so that said ion implant apparatus produces an ion beam comprising As$_2$+ ions, wherein said ion beam has a beam density and a beam energy;
   implanting impurities into said source/drain regions of said integrated circuit wafer, wherein said impurities consist of As$_2$+ ions implanted using a single ion implantation step and said ion beam; and
   annealing said integrated circuit wafer having As$_2$+ ions implanted at an anneal temperature for an anneal time.

9. The method of claim 8 wherein said adjusting said ion implant apparatus so that said ion implant apparatus produces an ion beam comprising $As_2+$ ions uses a magnetic analyzer.

10. The method of claim 8 wherein said beam density is between about $4 \times 10^{14}$ and $6 \times 10^{14}$ ions/cm$^2$.

11. The method of claim 8 wherein said beam energy is between about 20 and 48 KeV.

12. The method of claim 8 wherein said anneal temperature is between about 900° C. and 1100° C.

13. The method of claim 8 wherein said anneal time is between about 10 and 20 seconds.

14. The method of claim 8 wherein said arsenic ion source comprises solid arsenic.

15. A method of doping a polysilicon electrode, comprising the steps of:
   providing a semiconductor integrated circuit wafer having a polysilicon electrode formed thereon;
   providing an ion implant apparatus;
   placing a phosphorous ion source in said ion implant apparatus;
   adjusting said ion implant apparatus so that said ion implant apparatus produces an ion beam comprising $P_2+$ ions, wherein said ion beam has a beam density and a beam energy;
   implanting impurities into said polysilicon electrode, wherein said impurities consist of $P_2+$ ions implanted using a single ion implantation step and said ion beam; and
   annealing said integrated circuit wafer having $P_2+$ ions implanted at an anneal temperature for an anneal time.

16. The method of claim 15 wherein said adjusting said ion implant apparatus so that said ion implant apparatus produces an ion beam comprising $P_2+$ ions uses a magnetic analyzer.

17. The method of claim 15 wherein said beam density is between about $4 \times 10^{14}$ and $6 \times 10^{14}$ ions/cm$^2$.

18. The method of claim 15 wherein said beam energy is between about 20 and 48 KeV.

19. The method of claim 15 wherein said anneal temperature is between about 900° C. and 1100° C.

20. The method of claim 15 wherein said anneal time is between about 10 and 20 seconds.

21. The method of claim 15 wherein said phosphorous ion source comprises solid phosphorous.

22. A method of doping a polysilicon electrode, comprising the steps of:
   providing a semiconductor integrated circuit wafer having a polysilicon electrode formed thereon;
   providing an ion implant apparatus;
   placing a arsenic ion source in said ion implant apparatus;
   adjusting said ion implant apparatus so that said ion implant apparatus produces an ion beam comprising $As_2+$ ions, wherein said ion beam has a beam density and a beam energy;
   implanting impurities into said polysilicon electrode, wherein said impurities consist of $As_2+$ ions implanted using a single ion implantation step and said ion beam; and
   annealing said integrated circuit wafer having $As_2+$ ions implanted at an anneal temperature for an anneal time.

23. The method of claim 22 wherein said adjusting said ion implant apparatus so that said ion implant apparatus produces an ion beam comprising $As_2+$ ions uses a magnetic analyzer.

24. The method of claim 22 wherein said beam density is between about $4 \times 10^{14}$ and $6 \times 10^{14}$ ions/cm$^2$.

25. The method of claim 22 wherein said beam energy is between about 20 and 48 KeV.

26. The method of claim 22 wherein said anneal temperature is between about 900° C. and 1100° C.

27. The method of claim 22 wherein said anneal time is between about 10 and 20 seconds.

28. The method of claim 22 wherein said arsenic ion source comprises solid arsenic.

* * * * *

UNITED STATES PATENT AND TRADEMARK OFFICE
CERTIFICATE OF CORRECTION

| | |
|---|---|
| PATENT NO. | : 6,982,215 B1 |
| DATED | : January 3, 2006 |
| INVENTOR(S) | : Buan Heng Lee et al. |

Page 1 of 1

It is certified that error appears in the above-identified patent and that said Letters Patent is hereby corrected as shown below:

<u>Title page,</u>
Item [75], Inventors, delete "Zadig Cherng-Ching Lam, Arcadia, CA (US)" and replace with -- Zadig Cheung-Ching Lam, Arcadia, CA (US) --.

Signed and Sealed this

Thirtieth Day of May, 2006

JON W. DUDAS
*Director of the United States Patent and Trademark Office*